United States Patent
Bhargava et al.

(10) Patent No.: US 9,576,101 B2
(45) Date of Patent: Feb. 21, 2017

(54) CONFIGURABLE CELL DESIGN USING CAPACITIVE COUPLING FOR ENHANCED TIMING CLOSURE

(71) Applicants: Vijay Bhargava, Gurgaon (IN);
Naveen Kumar, Ghaziabad (IN);
Kushagra Khorwal, Ghaziabad (IN)

(72) Inventors: Vijay Bhargava, Gurgaon (IN);
Naveen Kumar, Ghaziabad (IN);
Kushagra Khorwal, Ghaziabad (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 11 days.

(21) Appl. No.: 14/635,827

(22) Filed: Mar. 2, 2015

(65) Prior Publication Data
US 2016/0259878 A1    Sep. 8, 2016

(51) Int. Cl.
*G06F 17/50* (2006.01)
(52) U.S. Cl.
CPC ....... *G06F 17/5081* (2013.01); *G06F 17/5031* (2013.01); *G06F 2217/62* (2013.01)
(58) Field of Classification Search
CPC .............. G06F 17/5031; G06F 2217/84; G06F 2217/62
USPC ......................................... 716/108, 113, 134
See application file for complete search history.

(56) References Cited

U.S. PATENT DOCUMENTS

| | | | |
|---|---|---|---|
| 5,309,015 A | 5/1994 | Kuwata | |
| 6,456,676 B1 | 9/2002 | O'Connor et al. | |
| 6,789,245 B2 | 9/2004 | Hojat | |
| 7,528,638 B2 | 5/2009 | Lee | |
| 8,316,340 B2 * | 11/2012 | Chen | G06F 17/5045 716/113 |
| 8,612,912 B1 * | 12/2013 | Chen | G06F 17/5081 716/110 |
| 2002/0060594 A1 | 5/2002 | Stasiak | |
| 2009/0064070 A1 * | 3/2009 | Kitahara | G06F 17/5068 716/113 |

OTHER PUBLICATIONS

Ateet Mishra, Uchit Singhal and Jatinder Kumar; "A Novel Approach for Improving OCV impact earlier in the design cycle", www.design-reuse.com/articles/32526/ocv-impact-earlier-in-the-ds, Design Reuse Sep. 30, 2014.

* cited by examiner

*Primary Examiner* — Nghia Doan
(74) *Attorney, Agent, or Firm* — Charles E. Bergere

(57) ABSTRACT

A method for achieving clock timing closure in an integrated circuit (IC) design includes designing an IC using one or more component cells selected from a cell library to produce the design. A timing analysis of the design is performed to determine if timing constraints are satisfied. When a given time constraint is not satisfied, a component cell selected from the cell library is replaced with a replacement cell that has the same function and the same footprint as the replaced component cell, but has a different timing characteristic based on the phase relationship of the signal being capacitively coupled to enhance the likelihood of meeting the given time constraint. The timing analysis is repeated with the replacement cell. The process of replacing component cells and performing timing analysis may be iterative.

9 Claims, 5 Drawing Sheets

CONFIGURABLE CELL DESIGN USING CAPACITIVE COUPLING FOR ENHANCED TIMING CLOSURE

BACKGROUND

The present invention relates generally to the design and fabrication of semiconductor integrated circuits, and more particularly to a method to achieve timing closure of a digital circuit design.

Very large integrated circuits, which are often referred to as systems-on-a-chip (SoCs), are designed by dividing the design into multiple modules. The modules are designed concurrently with coordination among the module design groups. Until the modules are stitched together, there is uncertainty as to whether the overall design will meet the specified design criteria, such as the frequency of operation and other timing constraints.

In some SoCs, a clock signal is generated by an oscillator and distributed throughout the SoC. When the clock signal, which may be routed on more than one metal layer of the integrated circuit, is distributed on a single conductor, referred to as a common path, variations on the common path influence the clock signal provided to the clock-signal-recipient components throughout the SoC. When the clock signal is distributed on a network of conductors, each bifurcation typically includes a buffer in each bifurcated branch conductor, which results in (i) a pre-bifurcation clock signal branch and (ii) each of the post-bifurcation clock signal branches having clock signals with slightly different variations. Thus, the clock signals provided to different clock-signal-recipient components throughout the SoC may be skewed. On-chip variations (OCV), such as process, voltage, and temperature (PVT) variations, compound clock signal variations. Clock signal variations are less tolerable in higher frequency applications due to the shorter clock period for signals to propagate. Accordingly, it would be advantageous to be able to test a SoC for clock signal variations.

DETAILED DESCRIPTION

Figure 1:
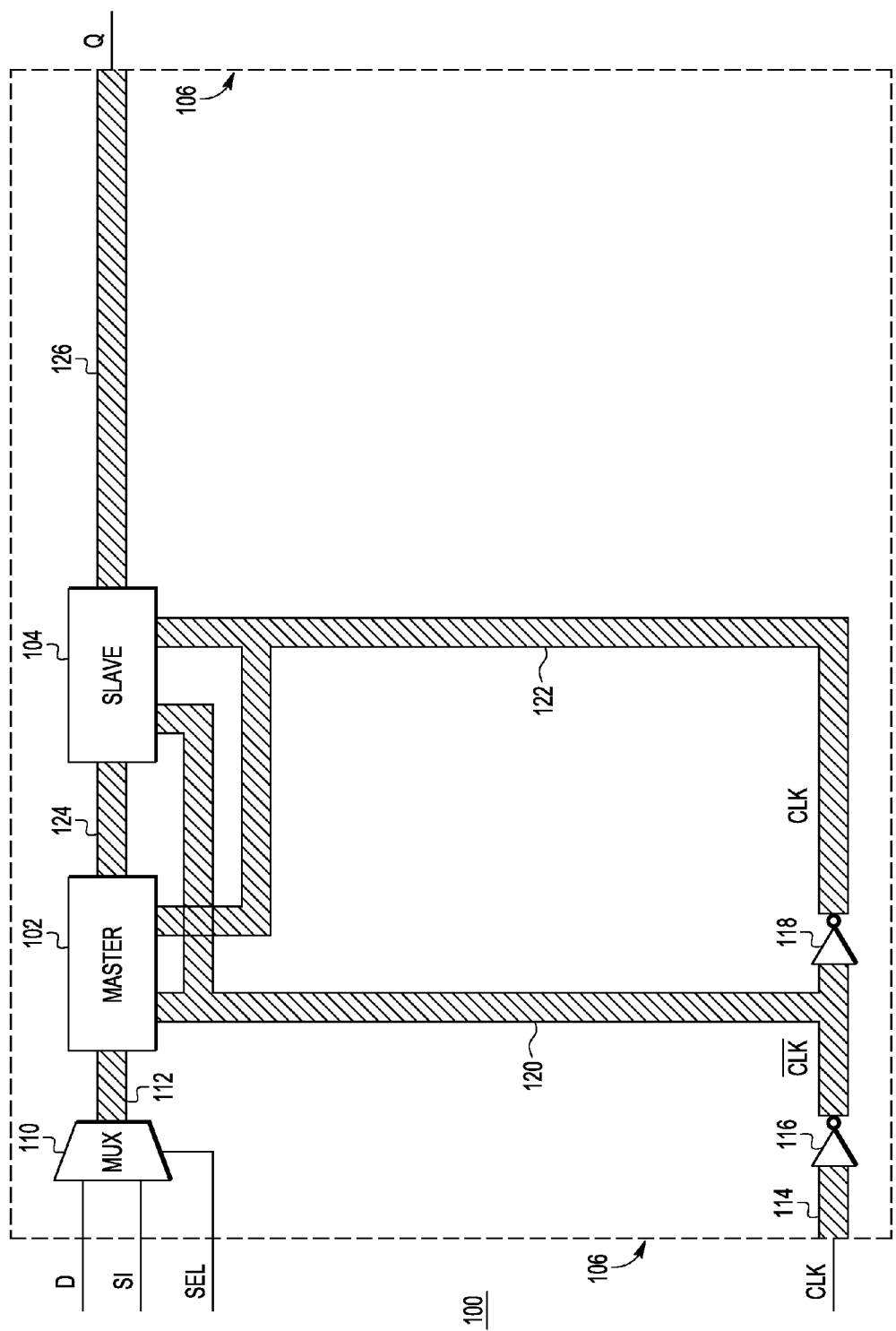
FIG. 1 is a circuit layout diagram of a flip-flop.

Detailed illustrative embodiments of the present invention are disclosed herein. However, specific structural and functional details disclosed herein are representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

A method for achieving timing closure in an integrated circuit design includes designing an integrated circuit using one or more existing component cells selected from a cell library to produce an integrated circuit design. A timing analysis of the integrated circuit design is performed to determine if timing constraints for the integrated circuit design are satisfied. When a given timing constraint is not satisfied, each of one or more existing component cells selected from the cell library is replaced with a respective replacement component cell which has the same function and footprint as the replaced component cell, and has a timing characteristic based on capacitive coupling that is selected to enhance the likelihood of meeting the given timing constraint. The timing analysis is repeated with the replacement component cell(s). Additional iterations may be conducted until timing constraints are satisfied.

Synchronous circuits are sequential logic circuits that are controlled by a global clock signal, generated by an oscillator, and distributed throughout a SoC. One way to increase throughput of a synchronous circuit is to increase the frequency of the clock. However, increasing clock frequency results in a shorter clock period for signals to propagate through logic. A shorter clock period provides a shorter duration for (i) set-up time during which control level signals are applied to inputs of clock driven circuits prior to the triggering edge of the clock pulse and (ii) hold time during which control level signals are maintained on inputs of clock driven circuits after the triggering edge of the clock pulse. Both adequate set-up time and adequate hold time are necessary for clock driven circuits to operate accurately and reliably. Clock signal variations are less tolerable in higher frequency applications due to the shorter clock period. On-chip variations (OCV), such as PVT variations, compound clock signal variations during operation of the SoC.

A signal on a conductor is influenced by signals on adjacent routed nets by capacitive coupling. Capacitive coupling is the effect on a conductor due to voltage fluctuations on a nearby conductor or conductors. Nearby conductor(s) within an integrated circuit may be in the same metal layer as the impacted conductor or they may be in a metal layer above or below the metal layer of the impacted conductor. For conductors in the same metal layer, the influence is greatest from adjacent, substantially parallel routed conductors. Design rules for each technology node define the standard spacing between conductors in each metal layer. To maintain the integrity of the clock signal in an integrated circuit, the clock net conductors are typically spaced a greater distance from conductors carrying non-clock signals than conductors carrying non-clock signals are spaced from each other. For example, for the technology node at which the integrated circuit is designed, conductors carrying clock signals may be required to be spaced from conductors carrying non-clock signals at twice the minimum spacing that conductors carrying non-clock signals are spaced from each other.

Design changes may be required in accordance with embodiments of the invention. After a sample is fabricated for testing, additional timing closure evaluations are conducted to evaluate whether the integrated circuit will operate at the frequency for which it was designed.

Although the clock signal may originate from a single source, it can arrive at recipient components located throughout the SoC at different times. The clock signal is skewed in time due to many factors including the length of the clock net conductor between the oscillator and each recipient component, intervening buffers in the clock net, capacitive coupling, and local PVT variations. As SoCs operate at higher frequencies, timing closure becomes more important and concomitantly, less variation in the clock signal can be tolerated for the SoC to operate accurately and reliably.

Embodiments of the invention provide a technique to replace an existing component cell, such as a flip-flop, in an integrated circuit design, with a replacement component cell from a cell library. The replacement component cell performs the same function and has the same foot print as the existing component cell, but is selected for its different timing characteristic. The existing component cell may be replaced, for example, due to a late-in-the-design timing analysis or as the result of an engineering change order (ECO). In this manner, an existing component cell producing an unacceptable timing characteristic can be replaced with a component cell having a different timing characteristic in order to satisfy operation specifications.

Embodiments of the invention will be described with respect to flip-flops, although the invention is not limited thereto. The invention is applicable to any component cell having a timing characteristic that can be impacted by capacitive coupling.

FIG. 1 is a circuit layout diagram of a master-slave D-type flip-flop 100. The flip-flop 100 includes two gated latches, a master latch 102 and a slave latch 104, connected in series.

Signals input to or output from the flip-flop 100 cross the perimeter of the area allocated for the flip-flop 100 defining a footprint 106. The footprint 106 facilitates incorporating various instantiations of the flip-flop 100 into an integrated circuit design. The flip-flop 100 is one of a plurality of such component cells in a library of component cells available to be incorporated into an integrated circuit design. The complete library includes component cells having different functions, layouts, and timing characteristics. According to embodiments of the present invention, however, the library has subsets of component cells, where the different component cells in each subset perform the same function and have the same footprint, but have different timing characteristics.

The flip-flop 100 may include a multiplexer 110 connected to receive either a data input, D, or a test or scan in signal, SI, as determined by the state of the select signal, SEL. When SEL is in a first state, such as during testing of the integrated circuit design or during testing of the integrated circuit after fabrication, the SI input to the multiplexer 110 is provided at the output of the multiplexer 110 on the trace 112 which is the D input to the master latch 102. When SEL is in a second state, such as during normal IC operations, the D input to the multiplexer 110 is provided at the output of the multiplexer 110 on the trace 112 as the D input to the master latch 102.

Another signal input to the flip-flop 100 is the clock signal, CLK. The CLK signal is conducted on the trace 114 to the inverter 116, which inverts the CLK signal forming a /CLK signal. The /CLK signal is conducted on the trace 120 to the master latch 102, the slave latch 104, and the inverter 118.

The inverter 118 inverts the /CLK signal to form a replica of the CLK signal, also referred to as the CLK signal, which is conducted to the master latch 102 and the slave latch 104 on the trace 122. The Q output from the master latch 102 provides the D input to the slave latch 104 on the trace 124. Where the traces 120 and 122 appear in FIG. 1 to overlap is resolved by routing the metal of one of the traces 120 or 122 to a higher or lower metal layer to bypass the other trace 122 or 120, as is known in the art. The Q output from the slave latch 104 is conducted to the perimeter of the footprint 106 on the trace 126 as an output Q of the flip-flop 100.

The slave latch 104 has a drive transistor (not shown) that is sized differently in various instantiations of the flip-flop 100. The slave latch 104 drive transistor is also the drive transistor for the flip-flop 100. Larger drive transistors require more die area, generate relatively more current, and provide a stronger drive signal, which concomitantly produces a faster slew rate instantiation of the flip flop 100. Conversely, smaller drive transistors require less die area, generate relatively less current, and provide a weaker drive signal, which concomitantly produces a slower slew rate instantiation of the flip flop 100. The size of the drive transistor is not the only variable that impacts the timing characteristic of a component cell, such as the flip flop 100. As will be discussed in more detail below, capacitive coupling also impacts the timing characteristic of a component cell, such as the flip flop 100. Empirical data can be used to ascertain the component cell's overall slew rate.

Capacitive coupling is usually considered noise, but, under some circumstances, capacitive coupling can be used advantageously. Capacitive coupling can be used to change the timing (e.g., overall slew rate) of component cells.

Figure 2:
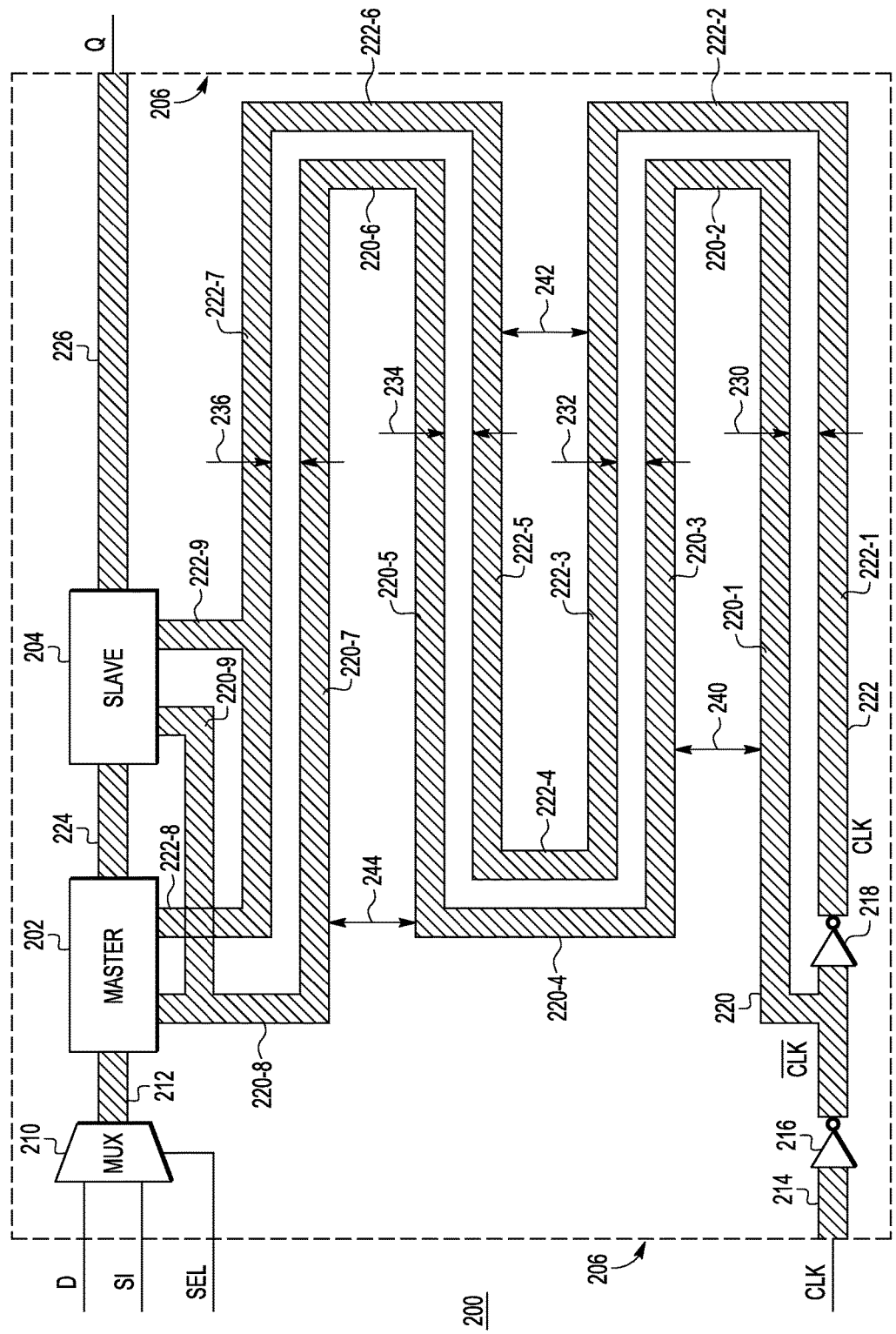
FIG. 2 is a circuit layout diagram of a flip-flop that can have a different timing characteristic than the flip-flop of FIG. 1.

FIG. 2 is a circuit layout diagram of a master-slave D-type flip-flop 200. The flip-flop 200 operates in a manner similar to the operation of the flip-flop 100 of FIG. 1 described above using analogous elements that are analogously labeled. The flip-flop 200 is another of the plurality of component cells in the cell library available to be incorporated into an integrated circuit design. The flip-flop 200 has a footprint 206 that is the same size as the footprint 106 of the flip-flop 100, and a timing characteristic that is different from the timing characteristic of the flip-flop 100.

Depending on how they are implemented, the flip-flop 100 may have a faster or slower slew rate and/or delay than the flip-flop 200. When the drive transistor in the flip-flop 100 is the same size as the drive transistor in the flip-flop 200, the flip flop 100 will have a faster slew rate than the flip-flop 200 due to the greater capacitive coupling in the flip-flop 200, which decreases the slew rate and increase the propagation delay of the flip-flop 200, i.e., CLK-Q.

As in the flip-flop 100, the CLK signal is provided as an input to the flip-flop 200. The CLK signal is conducted on the trace 214 to the inverter 216 which inverts the CLK signal impressing the /CLK signal on the trace 220. The /CLK signal is inverted by the inverter 218 to generate a replica of the CLK signal, also referred to as the CLK signal, which is applied to the trace 222. The traces 220 and 222 are within capacitive coupling proximity of each other. As such, the CLK and /CLK signals interact via capacitive coupling as the signals are transmitted along the respective traces 222 and 220 to the master latch 202 and the slave latch 204. Influences that enhance the effectiveness of capacitive coupling compared to the analogous traces 122 and 120 of the flip-flop 100 of FIG. 1 include longer, adjacent, closely spaced, and/or substantially parallel routed traces.

Within the footprint 206, the traces 220 and 222 may be routed in various patterns to remain within capacitive coupling proximity of each other. One possible pattern shown in FIG. 2 is as nested boustrophedonic traces. A boustrophedonic trace is routed to extend back and forth in opposite directions, reversing direction to extend back in the previous direction, one or more times. With the traces 220 and 222 nested, they remain adjacent to and within capacitive coupling proximity of each other through straight, substantially parallel segments as well as through the reversing portions of the traces 220 and 222.

The traces 220 and 222 extend parallel to each other to the right of the inverters 216 and 218 as the trace segments 220-1 and 222-1, respectively, then reverse direction through the trace segments 220-2, 222-2, 220-3, and 222-3 to extend to the left. The traces 220 and 222 reverse direction again through the trace segments 220-4, 222-4, 220-5, and 222-5 to extend to the right. The traces 220 and 222 again reverse direction through the trace segments 220-6, 222-6, 220-7, and 222-7 to extend to the left. The trace 220 extends to the master latch 202 through the segment 220-8, and to the slave latch 204 through the segment 220-9. The trace 222 extends to the master latch 202 through the segment 222-8, and to the slave latch 204 through the segment 222-9. Where the trace segments 220-9 and 222-8 appear to overlap is resolved by routing the metal of one of the traces to a higher or lower level of metal to bypass the other trace, as is known in the art.

Capacitive coupling is stronger with adjacent traces that are more closely spaced within capacitive coupling proximity and/or have longer parallel segments. Stronger capacitive coupling implies slower slew rate and greater propagation delay. In addition, if the two conductors are carrying instantiations of the same signal, and the two instantiations of the signal are 180 degrees out of phase, then the slew rate will be slower and the propagation delay will be greater because of the inverse relation between the propagating signals than if the two instantiations of the signal are in phase.

In the flip-flop 200, the CLK signal and the /CLK signal interact with each other via greater capacitive coupling resulting in slower operation than in the flip-flop 100 of FIG. 1, which has less capacitive coupling. Slower operation means that the logic transitions from low-to-high, and vice versa, (e.g., the slew rate of the clock signal transitions) occur more slowly than the transitions would occur on a trace carrying either the CLK or /CLK signal where the trace is more isolated from the influence of capacitive coupling with a trace carrying the respective inverted signal, /CLK or CLK, or another digital signal.

All or a portion of the adjacent trace segments in the nested boustrophedonic traces 220 and 222 where capacitive coupling is desired are spaced apart a distance within capacitive coupling proximity. One possible distance is the minimum spacing between conductors carrying non-clock signals for the technology node at which the integrated circuit is designed. Such distance is typically half of the minimum spacing between a conductor carrying clock signals and a conductor carrying non-clock signals for the technology node at which the integrated circuit is designed. For example, in FIG. 2, the distance 230 between the trace segments 222-1 and 220-1, the distance 232 between the trace segments 220-3 and 222-3, the distance 234 between the trace segments 222-5 and 220-5, and the distance 236 between the trace segments 220-7 and 222-7 are at the minimum spacing for conductors carrying non-clock signals for the technology node.

While the flip-flop 200 has been described as (i) receiving the CLK signal, (ii) generating, via the inverter 216, a /CLK signal, (iii) generating, from the /CLK signal via the inverter 218, a replica of the CLK signal, and (iv) applying the /CLK signal on the trace 220 and the replica of the CLK signal on the trace 222, which provides the /CLK signal and its inverse, the replica of the CLK signal, on the adjacent traces 220 and 222, respectively, within capacitive coupling proximity of each other, the invention is not limited thereto. In some embodiments of the invention, the received CLK signal and its inverse, the /CLK signal, are applied to the adjacent traces within capacitive coupling proximity of each other. In those embodiments, the component cell needs only one inverter analogous to the inverter 216, which is used to generate the /CLK signal from the received CLK signal.

Having a configurable flip-flop circuit layout that could be configured to provide either a flip-flop that provides a faster signal or a flip-flop that provides a slower signal would be useful during metal engineering change orders.

Figure 3:
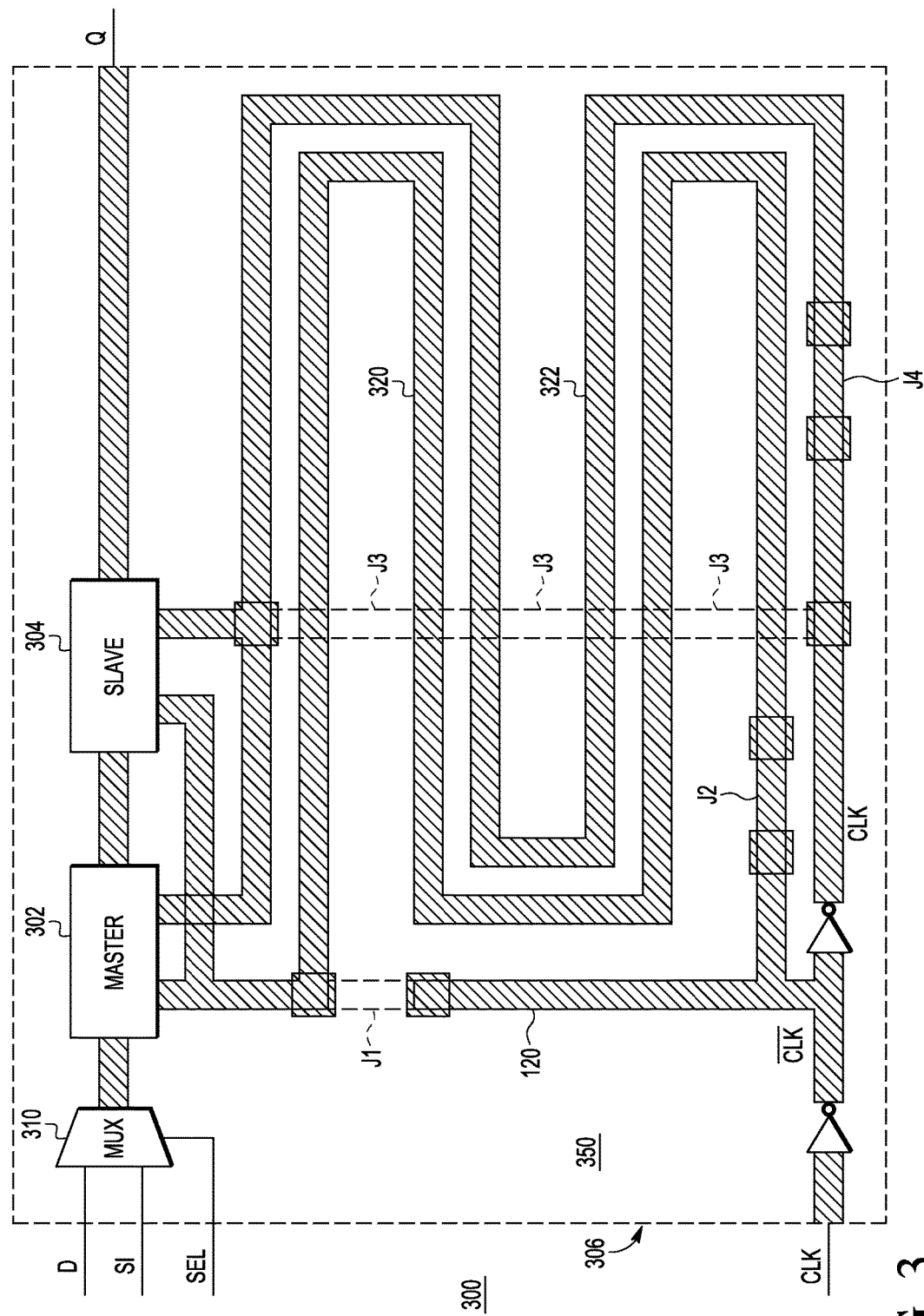
FIG. 3 is a circuit layout diagram of a configurable circuit that utilizes jumpers to realize a flip-flop that provides a circuit layout analogous to the flip-flop of FIG. 2.
Figure 4:
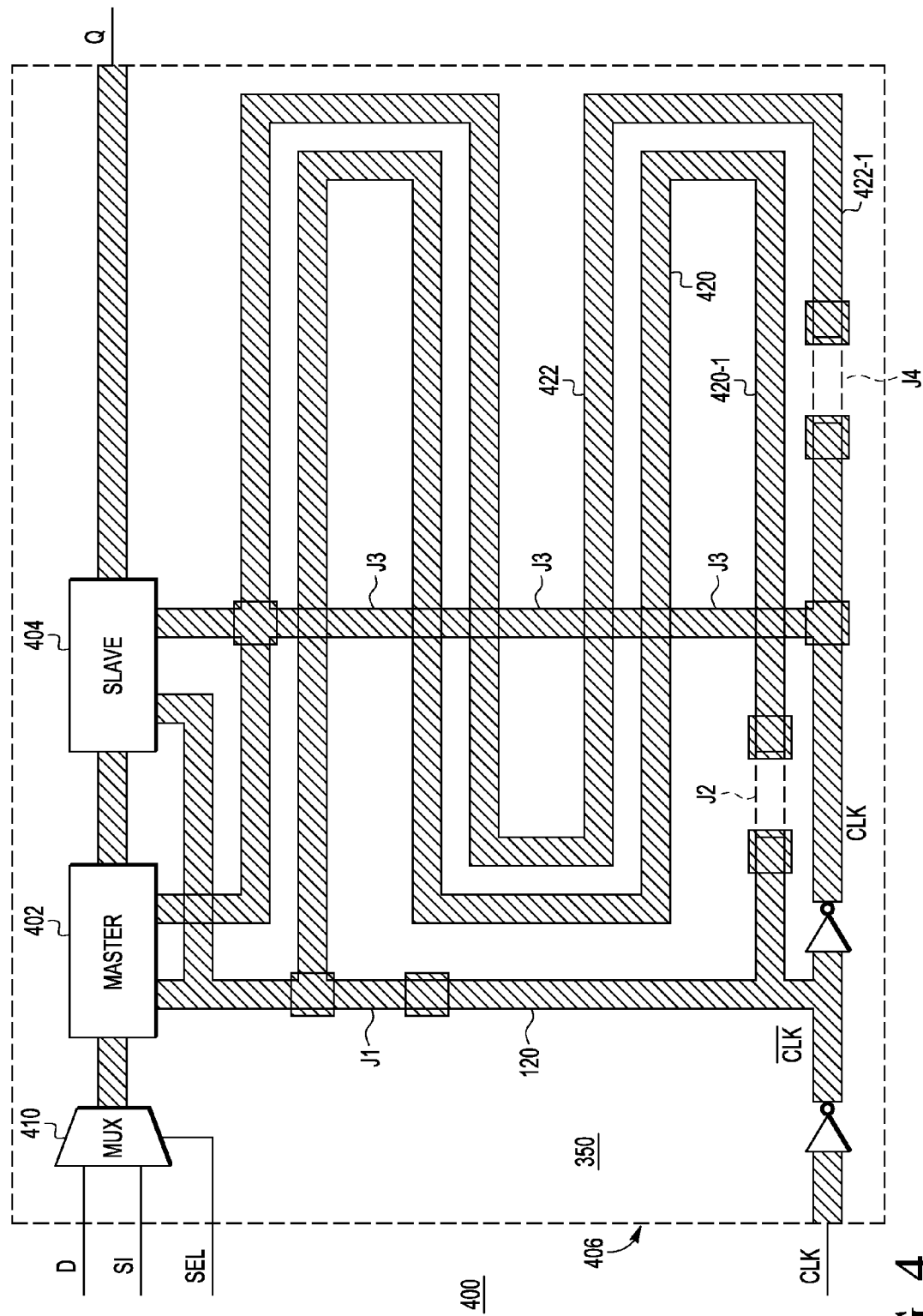
FIG. 4 is a circuit layout diagram of the same configurable circuit that utilizes jumpers to realize a flip-flop that provides a circuit layout analogous to the flip-flop of FIG. 1.

FIGS. 3 and 4 are different instantiations of flip-flops derived from the same configurable layout 350. The configurable layout 350 has traces that are configurable into at least two different instantiations with respectively different timing characteristics. Discontinuous segments of the traces are selectively bridged using conductive jumpers to form the desired trace structure which, concomitantly, provides a faster or slower instantiation of the configured flip-flop.

FIG. 3 is a circuit layout diagram of a flip-flop 300 that provides a completed trace structure by configuring certain jumpers in the configurable layout 350. The flip-flop 300 operates in a manner similar to the operation of the flip-flop 200 described above using analogous elements that are analogously labeled. Conductive segments, indicated as the jumpers J2 and J4, are included in the configurable flip-flop layout 350 to bridge discontinuous segments to provide the particular instantiation of the configurable layout 350 which is the flip-flop 300. The flip-flop 300 is another of the plurality of component cells in a cell library available to be incorporated into an integrated circuit design having the same function and layout as flip-flops 100 and 200.

FIG. 4 is a circuit layout diagram of a flip-flop 400 that provides a completed trace structure by configuring certain other jumpers in the configurable flip-flop circuit layout 350. The flip-flop 400 operates in a manner similar to the operation of the flip-flop 100 described above using analogous elements that are analogously labeled. Conductive segments, indicated as the jumpers J1 and J3, are included in the configurable flip-flop circuit layout 350 to bridge discontinuous segments to provide the particular instantiation of the configurable layout 350 which is the flip-flop 400. Note that the jumper J3, as is known in the art, will be routed to a higher or lower level of metal to bypass portions of the traces 420 and 422. The flip-flop 400 is another of the plurality of component cells in the cell library available to be incorporated into an integrated circuit design having the same function and layout as flip-flops 100, 200, and 300.

Timing closure is a process by which an integrated circuit design is evaluated to determine whether the circuit will operate reliably and accurately at the frequency it was designed to operate. Early timing closure evaluation, such as before a design is taped-out and a sample is fabricated for testing, may be accomplished on a computer or processor system using processor-based design tools or electronic design automation tools known to those skilled in the integrated circuit design art.

The electronic tools evaluate whether the integrated circuit will operate reliably and accurately at the frequency it was designed to operate by evaluating the impact signals carried on adjacent routed nets have on a signal carried on a conductor in proximity of the adjacent routed nets.

Figure 5:
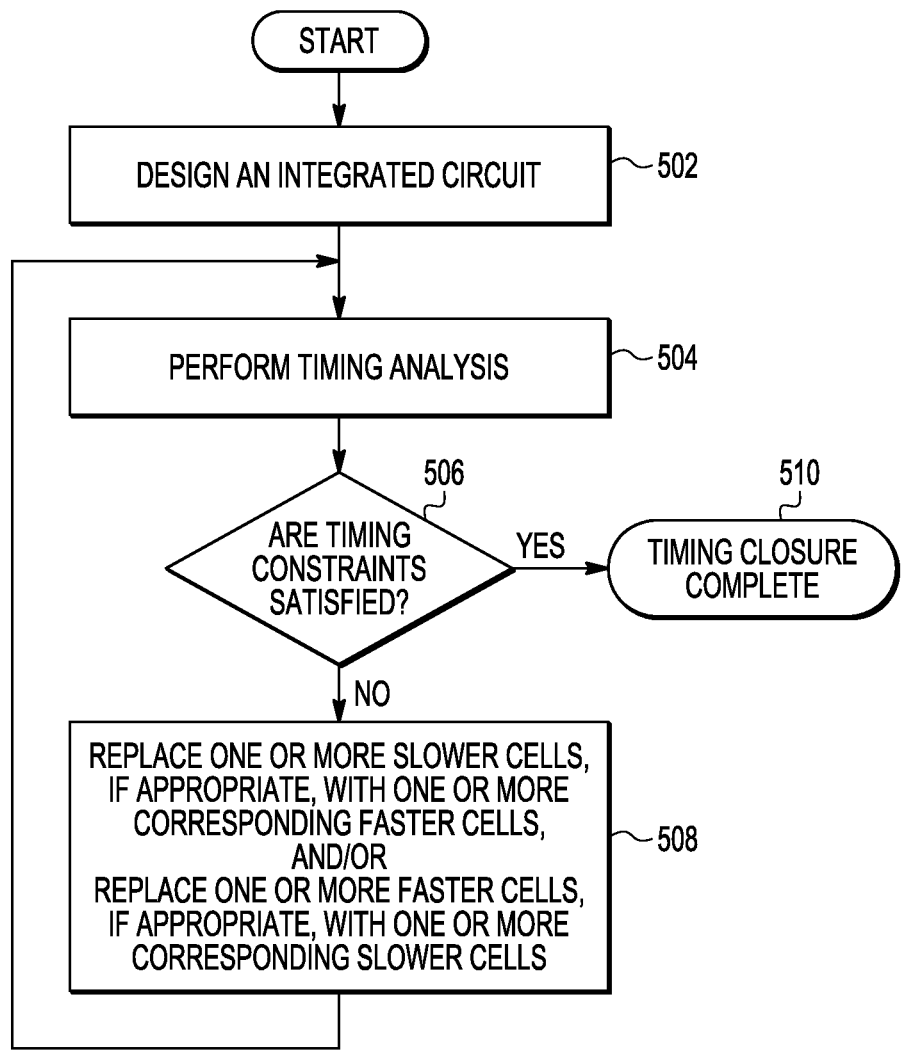
FIG. 5 is a flow chart of a method for designing an integrated circuit according to an embodiment of the present invention.

FIG. 5 is a simplified flow chart of a method for achieving timing closure in an integrated circuit design according to an embodiment of the invention. The method of FIG. 5 replaces existing component cells that do not satisfy the requisite timing constraints with respective replacement component cells that perform the same function, have the same footprint, and a different timing characteristic. The replacement component cell has a different level of capacitive coupling that makes the timing characteristic of the replacement component cell either faster or slower than the existing component cell. The method of FIG. 5 is implemented using a processor or computer system as described previously.

In step 502, an integrated circuit is designed, consistent with the design rules for the technology node in which the integrated circuit will be fabricated, using one or more component cells selected from a cell library.

In step 504, a timing analysis is performed on the integrated circuit design to determine if timing constraints for the integrated circuit design are satisfied. The timing analysis may be a static timing analysis or other known timing analysis technique. Timing analysis is performed on the current integrated circuit design, for example, to determine (i) whether the propagation delay between the occurrence of an input transition and the occurrence of the corresponding output transition of a component cell, such as a flip-flop, is acceptable, (ii) whether the setup time required for control levels to be applied to a component cell prior to the triggering edge of a clock pulse is met, and/or (iii) whether the hold time, which is the time interval required for control levels to remain on the inputs of a component cell after the triggering edge of a clock pulse in order to reliably activate the component cell, is/are met.

In step 506, if the timing analysis results in a negative determination, that is, the timing analysis determines that one or more given time constraints for the integrated circuit design are not satisfied, then, in step 508, each of one or more component cells, e.g., logic gates, flip-flops, and/or other logic circuits, is replaced with a function-compatible, footprint-compatible component cell having a different timing characteristic that is selected to meet or at least enhance the likelihood of meeting the given time constraint(s).

After step 508, the timing analysis of step 504 is repeated for the modified integrated circuit design with the replacement component cell(s) to determine if the timing constraints are satisfied. Significantly, steps 504 and 506 are repeated with the modified integrated circuit design without having to repeat step 502. An iterative loop of steps 504, 506, and 508 is repeated until all timing constraints are satisfied and timing closure is met, which produces an affirmative result in step 506 and indicates that the timing closure is complete at step 510.

There may be subsequent steps performed to complete the design or analysis of the integrated circuit as is known to those of ordinary skill in the integrated circuit design art.

An integrated circuit designed in accordance with an embodiment of the invention would have from one to many capacitively coupled component cells not only in the design, but also in the fabricated integrated circuit. In some embodiments, instructions for implementing the method steps described above with respect to FIG. 5, would be stored in memory, non-transient storage medium, or other medium. The medium would store the method step instructions on a processor-readable storage medium as a sequence of instructions which, when executed by a processor, perform the method steps for designing an integrated circuit as described above. The medium would have program code tangibly embodied thereon.

One conventional method for designing integrated circuits usable in step 502 of FIG. 5 includes a step of performing a logic synthesis process to generate a gate-level representation of an integrated circuit design. The synthesis uses any available component cells selected from a cell library. Another step in the conventional method includes performing a placement process in which the selected component cells are assigned non-overlapping locations on the integrated circuit die. The conventional method for designing integrated circuits also includes performing a signal distribution network synthesis process to construct one or more signal distribution networks. Another step includes performing a routing process to add conductors to the integrated circuit design. Other methods to design integrated circuits also exist.

While embodiments of the invention have been described in the context of master-slave latch D-type flip-flops, the invention is not limited thereto. The invention is applicable to any component cell in which capacitive coupling could impact the cell's timing characteristic.

Also for purposes of this description, the terms "couple," "couples," "coupling," "coupled," "connect," "connects," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes, ports, or paths may be referred to by the same name and are interchangeable for purposes here.

Embodiments of the invention can be manifest in the form of methods and apparatuses for practicing those methods. Embodiments of the invention can also be manifest in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention.

Embodiments of the invention can also be manifest in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits Any suitable processor-usable/readable or computer-usable/readable storage medium may be utilized. The storage medium may be (without limitation) an electronic, magnetic, optical, electromagnetic, infrared, or semiconductor system, apparatus, or device. A more-specific, non-exhaustive list of possible storage media include a magnetic tape, a portable computer diskette, a hard disk, a random access memory (RAM), a read-only memory (ROM), an erasable programmable read-only memory (EPROM) or Flash memory, a portable compact disc read-only memory (CD-ROM), an optical storage device, and a magnetic storage device. Note that the storage medium could even be paper or another suitable medium upon which the program is printed, since the program can be electronically captured via, for instance, optical scanning of the printing, then compiled, interpreted, or otherwise processed in a suitable manner including but not limited to optical character recognition, if necessary, and then stored in a processor or computer memory. In the context of this disclosure, a suitable storage medium may be any medium that can contain or store a program for use by or in connection with an instruction execution system, apparatus, or device.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method for designing an integrated circuit that satisfies time constraints using a processor-based design tool, the method comprising:

generating an initial integrated circuit design using a cell library of component cells and the design tool, wherein at least a first component cell in the initial integrated circuit design is part of a first subset of component cells having a same function and a same footprint;

performing a timing analysis on the initial integrated circuit design;

determining that the initial integrated circuit design does not satisfy the time constraints;

generating a modified integrated circuit design using the design tool by replacing the first component cell with a replacement component cell that (i) is part of the first subset of component cells and (ii) has a timing characteristic such that the modified integrated circuit design satisfies the time constraints, wherein the timing characteristics of the first component cell and the replacement component cell differ based on different capacitive coupling;

performing the timing analysis on the modified integrated circuit design;

determining whether the modified integrated circuit design satisfies the time constraints for the integrated circuit; and fabricating an integrated circuit using the modified integrated circuit design, wherein one of the first and replacement component cells is a faster component cell and the other is a slower component cell, and the slower component cell has stronger capacitive coupling than the faster component cell.

2. The method of claim 1, wherein the stronger capacitive coupling results from out of phase signals travelling on a pair of traces in the slower component cell being closer together and longer than a corresponding pair of traces in the faster component cell.

3. The method of claim 2, wherein all or a portion of the pair of traces in the slower component cell have a spacing that is less than a minimum spacing for conductors carrying clock signals throughout the integrated circuit for a technology node at which the integrated circuit is designed.

4. The method of claim 2, wherein all or a portion of the pair of traces in the slower component cell have a spacing that is the spacing for conductors carrying non-clock signals for a technology node at which the integrated circuit is designed.

5. The method of claim 1, wherein the stronger capacitive coupling results from a pair of traces in the slower component cell being longer than a corresponding pair of traces in the faster component cell.

6. The method of claim 5, wherein the pair of traces in the slower component cell are nested boustrophedonic traces.

7. The method of claim 1, wherein the first subset of component cells comprises a configurable component cell having a configurable layout that can be configured to provide different instantiations having different timing characteristics.

8. The method of claim 7, wherein the configurable component cell is configured using jumpers to bridge discontinuous segments of traces.

9. The method of claim 8, wherein at least one jumper is fabricated in a different metal layer than other traces of the configurable component cell.

* * * * *